United States Patent
Liu

(10) Patent No.: US 10,069,115 B2
(45) Date of Patent: Sep. 4, 2018

(54) PACKAGE METHOD OF SUBSTRATE

(71) Applicant: Shenzhen China Star Optoelectronics Technology Co., Ltd., Shenzhen (CN)

(72) Inventor: Yawei Liu, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 203 days.

(21) Appl. No.: 15/105,570

(22) PCT Filed: Apr. 26, 2016

(86) PCT No.: PCT/CN2016/080188
§ 371 (c)(1),
(2) Date: Jun. 17, 2016

(87) PCT Pub. No.: WO2017/156829
PCT Pub. Date: Sep. 21, 2017

(65) Prior Publication Data
US 2018/0102504 A1  Apr. 12, 2018

(30) Foreign Application Priority Data
Mar. 20, 2016 (CN) .......................... 2016 1 0152445

(51) Int. Cl.
H01L 21/00 (2006.01)
H01L 51/56 (2006.01)
H01L 51/52 (2006.01)
C03C 25/6226 (2018.01)
C03C 27/06 (2006.01)

(52) U.S. Cl.
CPC .......... *H01L 51/56* (2013.01); *C03C 25/6226* (2013.01); *C03C 27/06* (2013.01); *H01L 51/52* (2013.01); *H01L 51/5237* (2013.01); *H01L 2251/566* (2013.01)

(58) Field of Classification Search
CPC ..... H01L 51/56; H01L 51/5237; H01L 51/52; C23C 25/6226; C23C 27/06
See application file for complete search history.

(56) References Cited

FOREIGN PATENT DOCUMENTS

CN  CN104362243 A  2/2015

OTHER PUBLICATIONS

Machine translation of CN104362243, Feb. 2018.*

* cited by examiner

*Primary Examiner* — Richard Booth
(74) *Attorney, Agent, or Firm* — Leong C. Lei

(57) ABSTRACT

The present invention provides a package method of a substrate. By forming a plurality of support parts which are separately located at the border position of the package cover plate, the gap of the package cover plate and the substrate is limited after para bonding the package cover plate and the substrate. Thus, the seal height of the seal which does not contain the spacers can be ensured, and under circumstance of certain seal coating volume, the seal width of the seal also can be ensured. Furthermore, by cutting off the plurality of support parts, and border parts of the substrate and the package cover plate contacting with the support parts, the substrate packaged with the seal which does not contain the spacers can be obtained, and it is ensured that the seal has the consistent height and width.

11 Claims, 6 Drawing Sheets

US 10,069,115 B2

PACKAGE METHOD OF SUBSTRATE

FIELD OF THE INVENTION

The present invention relates to a display technology field, and more particularly to a package method of a substrate.

BACKGROUND OF THE INVENTION

In the display technology field, the panel display skill (LCD, OLED) has been gradually replaced the CRT displays. The flat light source technology is a new type light source and its skill development has been reached up for the mass production level of the market. In the flat panel display and flat light source technologies, the attachment of two sheet glasses is a very important skill. The package result directly influences the performance of the elements.

The ultraviolet (UV) curing technology is the earliest and the most common LCD/OLED package skill. It has properties below: no solvent or tiny solvent is used to reduce the pollution to the environment; less power consumption, low temperature curability is adaptable for the heat sensitive material; fast curing and high efficiency is applicable for the high speed production line, and the curing equipment merely occupies small space, etc.

Sometime, for preventing the spacers in the seal from crushing the TFT and the electrode wire on the TFT substrate, it is required to use the seal which does not contain the spacers for packaging. However, without the limitation of the spacers, the seal height and the seal width of the seal which does not contain the spacers is very difficult to control. It is possible that the differences of the seal height and the seal width can be exist for the present set of glasses and the previous set of glasses, or inside the same set of the glasses.

FIG. 1 is a diagram of a package method of a substrate according to prior art. As shown in FIG. 1, the package method comprises steps of: step 1, coating the seal 300 which does not contain the spacers at the border position of the package cover plate 100; step 2, oppositely assembling the package cover plate 100 and the substrate 200 for packaging, and then solidifying the seal 300 for accomplishing the package to the substrate 200. In the aforesaid package method of the substrate, the seal 300 does not contain the spacers. Thus, after oppositely assembling the package cover plate 100 and the substrate 200, the seal height and the seal width of the seal 300 is very difficult to control, and the seal height and the seal width of the seal 300 on various positions on the substrate 200 may not be uniform. Consequently, the tightness of the obtained package structure of the substrate is poor to lead to the failure of the package.

Therefore, there is a need to provide a package method of a substrate to solve the aforesaid issue.

SUMMARY OF THE INVENTION

An objective of the present invention is to provide a package method of a substrate, which utilizes seal which does not contain spacers for packaging the substrate, and ensures that the seal has the consistent height and width. The manufacture process is simple and easy, and the package result is great.

For realizing the aforesaid objective, the present invention provides a package method of a substrate, comprising steps of:

step 1, providing a package cover plate and a substrate for packaging, and a first cutting line of a frame shape is located at a border position of the package cover plate, and a second cutting line of a frame shape is located at a border position of the substrate;

step 2, forming a plurality of support parts which are separately located corresponding to a periphery of the first cutting line on the package cover plate, and meanwhile, the plurality of support parts are located corresponding to a periphery of the second cutting line on the substrate;

step 3, coating a circle of seal corresponding to an inner side of the first cutting line on the package cover plate, and meanwhile, the seal is located corresponding to an inner side of the second cutting line on the substrate;

step 4, para bonding the package cover plate and the substrate;

step 5, solidifying the seal;

step 6, cutting the package cover plate along the first cutting line, and cutting the substrate along the second cutting line to cut off the plurality of support parts, and border parts of the substrate and the package cover plate contacting with the plurality of support parts to achieve package of the package cover plate to the substrate.

The package cover plate is a glass substrate; the substrate comprises a TFT substrate and an OLED element located on the TFT substrate, and the second cutting line is located corresponding to a periphery of the OLED element on the substrate.

Material of the support part is an inorganic substance.

A shape of the support part is a strip or a column.

The plurality of support parts which are spaced enclose in a rectangular shape on the package cover plate.

Heights of the plurality of support parts are equal.

The heights of the support parts are 3-6 μm, and widths of the support parts are 0.1-10 mm.

The seal is a seal which does not contain spacers.

In the step 3, the seal is located corresponding to the OLED element and the second cutting line on the substrate.

In the step 5, a method of heating or ultraviolet light irradiation is employed to solidify the seal.

The present invention further provides a package method of a substrate, comprising steps of:

step 1, providing a package cover plate and a substrate for packaging, and a first cutting line of a frame shape is located at a border position of the package cover plate, and a second cutting line of a frame shape is located at a border position of the substrate;

step 2, forming a plurality of support parts which are separately located corresponding to a periphery of the first cutting line on the package cover plate, and meanwhile, the plurality of support parts are located corresponding to a periphery of the second cutting line on the substrate;

step 3, coating a circle of seal corresponding to an inner side of the first cutting line on the package cover plate, and meanwhile, the seal is located corresponding to an inner side of the second cutting line on the substrate;

step 4, para bonding the package cover plate and the substrate;

step 5, solidifying the seal;

step 6, cutting the package cover plate along the first cutting line, and cutting the substrate along the second cutting line to cut off the plurality of support parts, and border parts of the substrate and the package cover plate contacting with the plurality of support parts to achieve package of the package cover plate to the substrate;

wherein the package cover plate is a glass substrate; the substrate comprises a TFT substrate and an OLED element located on the TFT substrate, and the second cutting line is located corresponding to a periphery of the OLED element on the substrate;

wherein material of the support part is an inorganic substance;

wherein a shape of the support part is a strip or a column;

wherein the plurality of support parts which are spaced enclose in a rectangular shape on the package cover plate;

wherein heights of the plurality of support parts are equal.

The benefits of the present invention are: the present invention provides a package method of a substrate. By forming a plurality of support parts which are separately located at the border position of the package cover plate, the gap of the package cover plate and the substrate is limited after para bonding the package cover plate and the substrate. Thus, the seal height of the seal which does not contain the spacers can be ensured, and under circumstance of certain seal coating volume, the seal width of the seal also can be ensured. Furthermore, by cutting off the plurality of support parts, and border parts of the substrate and the package cover plate contacting with the support parts, the substrate packaged with the seal which does not contain the spacers can be obtained, and it is ensured that the seal has the consistent height and width. The manufacture process is simple and easy, and the package result is great.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
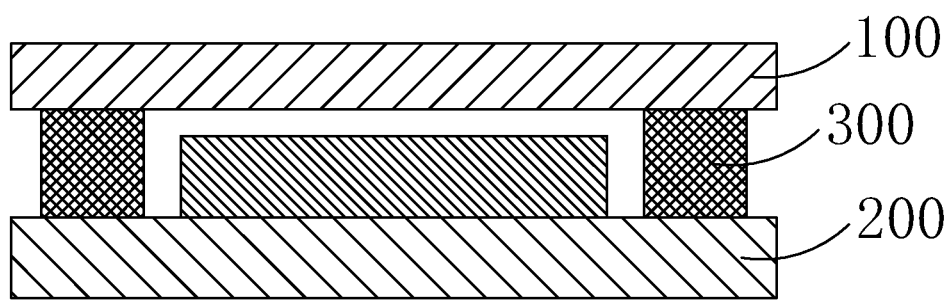
FIG. 1 is a diagram of a package method of a substrate according to prior art.
Figure 2:
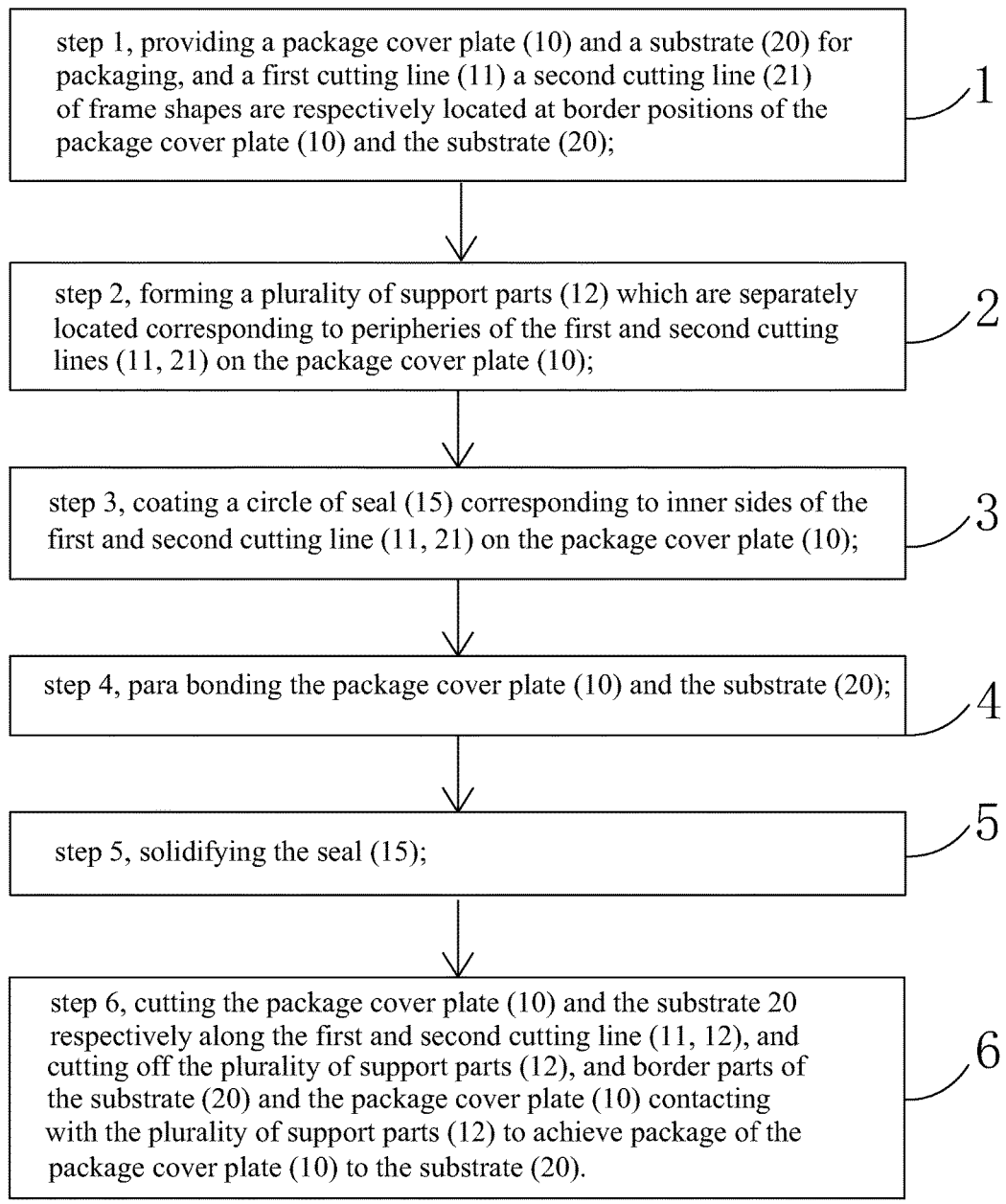
FIG. 2 is a flowchart of a package method of a substrate according to the present invention.
Figure 3:
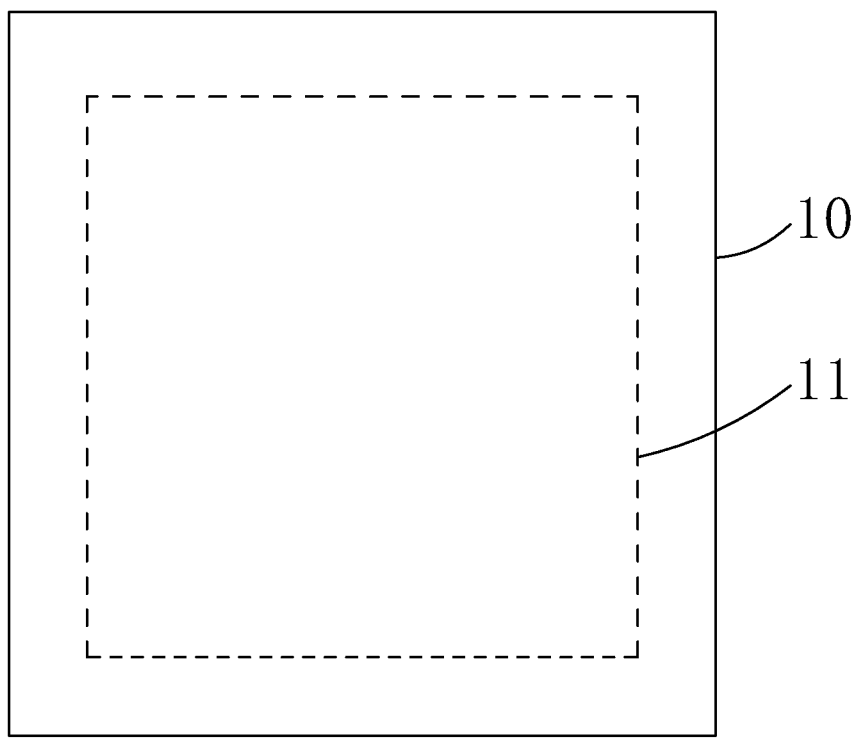
FIG. 3 is a structure diagram of a package cover plate provided in the step 1 of a package method of a substrate according to the present invention.
Figure 4:
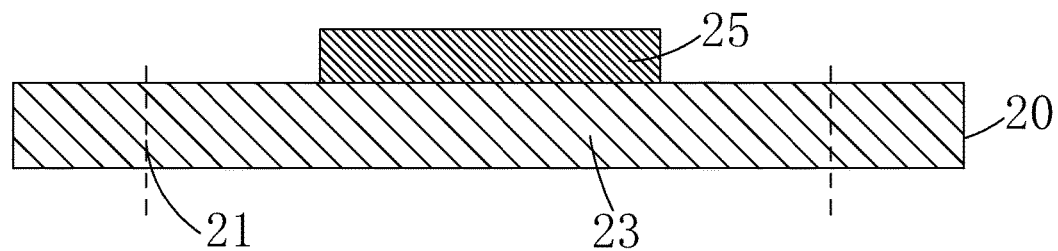
FIG. 4 is a structure diagram of a substrate for packaging provided in the step 1 of a package method of a substrate according to the present invention.

Please refer to FIG. 2. The present invention provides a package method of a substrate, comprising steps of:

step 1, as shown in FIG. 3 and FIG. 4, providing a package cover plate 10 and a substrate 20 for packaging, and a first cutting line 11 of a frame shape is located at a border position of the package cover plate 10, and a second cutting line 21 of a frame shape is located at a border position of the substrate 20.

Specifically, the package cover plate 10 is a glass substrate.

Figure 5:
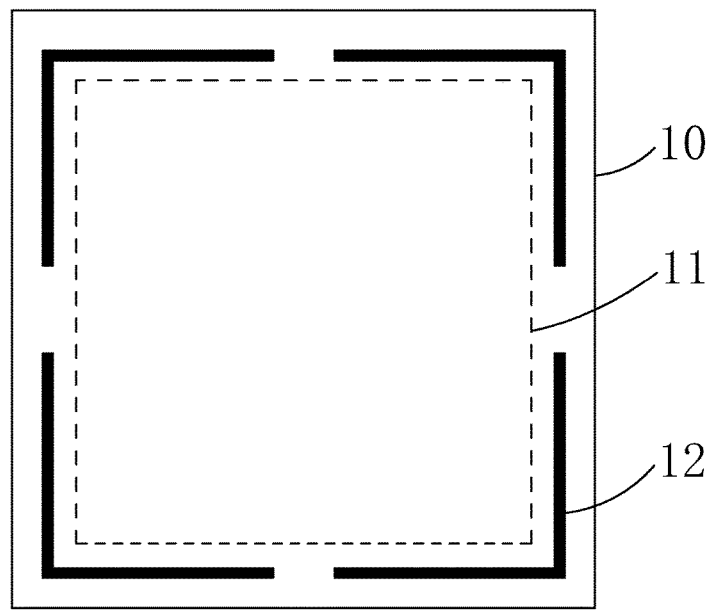
FIG. 5 is a diagram of the step 2 in a package method of a substrate according to the present invention.

Specifically, the substrate 20 is an OLED substrate, comprising a TFT substrate 23 and an OLED element 25 located on the TFT substrate 23, and the second cutting line 21 is located corresponding to a periphery of the OLED element 25 on the substrate 20.

step 2, as shown in FIG. 5, forming a plurality of support parts 12 which are separately located corresponding to a periphery of the first cutting line 11 on the package cover plate 10, and meanwhile, the plurality of support parts 12 are located corresponding to a periphery of the second cutting line 21 on the substrate 20.

Specifically, material of the support part 12 is an inorganic substance, such as silicon oxide ($SiO_2$), silicon nitride ($SiN_x$), and etc.

Furthermore, a shape of the support part 12 can be kinds of shapes, such as a strip (as shown in FIG. 5) or a column.

Preferably, the plurality of support parts 12 which are separately located enclose in a rectangular shape on the package cover plate 10.

The heights of the plurality of support parts 12 are equal. Specifically, the heights of the support parts 12 can be designed according to the gap of the upper, lower substrates for packaging.

Preferably, the heights of the support parts 12 are 3-6 μm, and widths of the support parts 12 are 0.1-10 mm.

Figure 6:
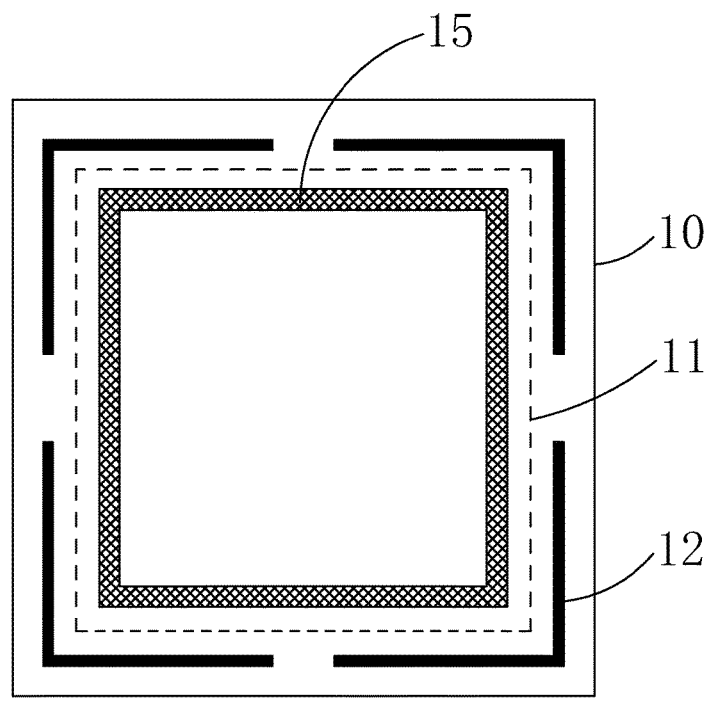
FIGS. 6-7 are diagrams of the step 3 in a package method of a substrate according to the present invention.
Figure 7:
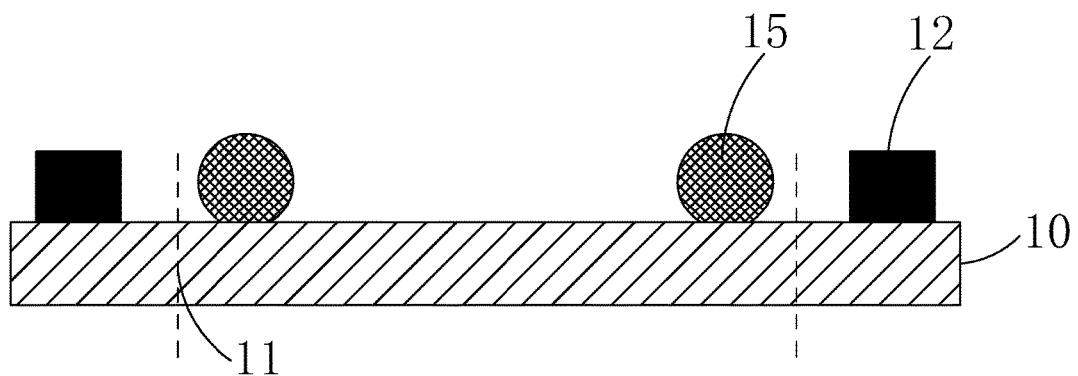

Specifically, in the step 2, the plurality of support parts 12 are formed with a chemical vapor deposition process and a photolithographic process.

step 3, as shown in FIG. 6 and FIG. 7, coating a circle of seal 15 corresponding to an inner side of the first cutting line 11 on the package cover plate 10, and meanwhile, the seal 15 is located corresponding to an inner side of the second cutting line 21 on the substrate 20.

Specifically, the seal 15 is a seal which does not contain spacers.

Figure 8:
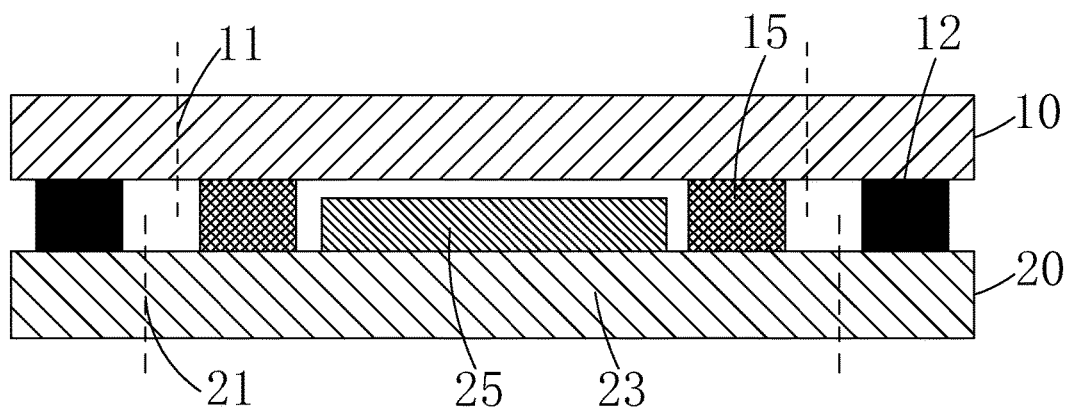
FIG. 8 is a diagram of the steps 4-5 in a package method of a substrate according to the present invention.

Specifically, the seal 15 is correspondingly located between the OLED element 25 on the substrate 20 and the second cutting line 21.

step 4, as shown in FIG. 8, para bonding the package cover plate 10 and the substrate 20.

step 5, as shown in FIG. 8, solidifying the seal 15.

Figure 9:
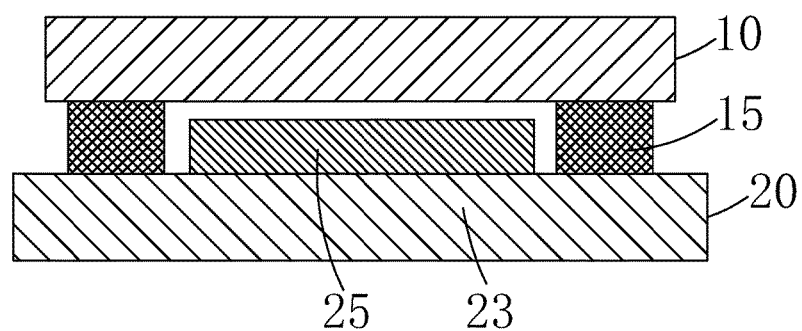
FIG. 9 is a diagram of the step 6 in a package method of a substrate according to the present invention.

Specifically, in the step 5, a method of heating or ultraviolet (UV) light irradiation is employed to solidify the seal 15 depending on the solidification condition of the seal 15.

step 6, as shown in FIG. 8 and FIG. 9, cutting the package cover plate 10 along the first cutting line 11, and cutting the substrate 20 along the second cutting line 21 to cut off the plurality of support parts 12, and border parts of the substrate 20 and the package cover plate 10 contacting with the plurality of support parts 12 to achieve package of the package cover plate 10 to the substrate 20.

In conclusion, the present invention provides a package method of a substrate. By forming a plurality of support parts which are separately located at the border position of the package cover plate, the gap of the package cover plate and the substrate is limited after para bonding the package cover plate and the substrate. Thus, the seal height of the seal which does not contain the spacers can be ensured, and under circumstance of certain seal coating volume, the seal width of the seal also can be ensured. Furthermore, by cutting off the plurality of support parts, and border parts of the substrate and the package cover plate contacting with the support parts, the substrate packaged with the seal which does not contain the spacers can be obtained, and it is ensured that the seal has the consistent height and width. The manufacture process is simple and easy, and the package result is great.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A package method of a substrate, comprising steps of:
   step 1, providing a package cover plate and a substrate for packaging, and a first cutting line of a frame shape is located at a border position of the package cover plate, and a second cutting line of a frame shape is located at a border position of the substrate;
   step 2, forming a plurality of support parts which are made of an inorganic substance and separately located corresponding to a periphery of the first cutting line on the package cover plate with a chemical vapor deposition process and a photolithographic process, and meanwhile, each of the plurality of support parts has a shape of a strip or a column with a height of 3-6 µm and a width of 0.1-10 mm, and the plurality of support parts are located corresponding to a periphery of the second cutting line on the substrate;
   step 3, coating a circle of seal corresponding to an inner side of the first cutting line on the package cover plate, and meanwhile, the seal is located corresponding to an inner side of the second cutting line on the substrate;
   step 4, para bonding the package cover plate and the substrate;
   step 5, solidifying the seal;
   step 6, cutting the package cover plate along the first cutting line, and cutting the substrate along the second cutting line to cut off the plurality of support parts, and border parts of the substrate and the package cover plate contacting with the plurality of support parts to achieve package of the package cover plate to the substrate.

2. The package method of the substrate according to claim 1, wherein the package cover plate is a glass substrate; the substrate comprises a TFT substrate and an OLED element located on the TFT substrate, and the second cutting line is located corresponding to a periphery of the OLED element on the substrate.

3. The package method of the substrate according to claim 1, wherein the plurality of support parts which are separately located enclose in a rectangular shape on the package cover plate.

4. The package method of the substrate according to claim 1, wherein heights of the plurality of support parts are equal.

5. The package method of the substrate according to claim 1, wherein the seal is a seal which does not contain spacers.

6. The package method of the substrate according to claim 2, wherein in step 3, the seal is located corresponding to the OLED element and the second cutting line on the substrate.

7. The package method of the substrate according to claim 1, wherein in step 5, a method of heating or ultraviolet light irradiation is employed to solidify the seal.

8. A package method of a substrate, comprising steps of:
   step 1, providing a package cover plate and a substrate for packaging, and a first cutting line of a frame shape is located at a border position of the package cover plate, and a second cutting line of a frame shape is located at a border position of the substrate;
   step 2, forming a plurality of support parts which are made of an inorganic substance and separately located corresponding to a periphery of the first cutting line on the package cover plate with a chemical vapor deposition process and a photolithographic process, and meanwhile, each of the plurality of support parts has a shape of a strip or a column with a height of 3-6 µm and a width of 0.1-10 mm, and the plurality of support parts are located corresponding to a periphery of the second cutting line on the substrate;
   step 3, coating a circle of seal corresponding to an inner side of the first cutting line on the package cover plate, and meanwhile, the seal is located corresponding to an inner side of the second cutting line on the substrate;
   step 4, para bonding the package cover plate and the substrate;
   step 5, solidifying the seal;
   step 6, cutting the package cover plate along the first cutting line, and cutting the substrate along the second cutting line to cut off the plurality of support parts, and border parts of the substrate and the package cover plate contacting with the plurality of support parts to achieve package of the package cover plate to the substrate;
   wherein the package cover plate is a glass substrate; the substrate comprises a TFT substrate and an OLED element located on the TFT substrate, and the second cutting line is located corresponding to a periphery of the OLED element on the substrate;
   wherein the plurality of support parts which are spaced enclose in a rectangular shape on the package cover plate;
   wherein heights of the plurality of support parts are equal.

9. The package method of the substrate according to claim 8, wherein the seal is a seal which does not contain spacers.

10. The package method of the substrate according to claim 8, wherein in step 3, the seal is located corresponding to the OLED element and the second cutting line on the substrate.

11. The package method of the substrate according to claim 8, wherein in step 5, a method of heating or ultraviolet light irradiation is employed to solidify the seal.

* * * * *